United States Patent
Liu et al.

(10) Patent No.: US 9,208,913 B2
(45) Date of Patent: Dec. 8, 2015

(54) WAVE-ABSORBING METAMATERIAL

(75) Inventors: Ruopeng Liu, Shenzhen (CN); Lin Luan, Shenzhen (CN); Zhiya Zhao, Shenzhen (CN); Wenjian Wang, Shenzhen (CN)

(73) Assignee: KUANG-CHI INNOVATIVE TECHNOLOGY LTD., Shenzhen (CN)

( * ) Notice: Subject to any disclaimer, the term of this patent is extended or adjusted under 35 U.S.C. 154(b) by 254 days.

(21) Appl. No.: 14/009,023

(22) PCT Filed: Nov. 30, 2011

(86) PCT No.: PCT/CN2011/083221
§ 371 (c)(1),
(2), (4) Date: Sep. 30, 2013

(87) PCT Pub. No.: WO2012/129924
PCT Pub. Date: Oct. 4, 2012

(65) Prior Publication Data
US 2014/0246608 A1    Sep. 4, 2014

(30) Foreign Application Priority Data

Mar. 31, 2011   (CN) .......................... 2011 1 0080843
Mar. 31, 2011   (CN) .......................... 2011 1 0081014

(51) Int. Cl.
*H01Q 17/00*   (2006.01)
*G21F 1/08*   (2006.01)
(Continued)

(52) U.S. Cl.
CPC .................. *G21F 1/08* (2013.01); *H01Q 17/00* (2013.01); *H01Q 17/002* (2013.01); *H05K 9/0086* (2013.01)

(58) Field of Classification Search
CPC ........... G21F 1/02; G21F 1/08; H05K 9/0073; H05K 9/0081; H05K 9/0086; H01Q 17/00; H01Q 17/002; H01Q 17/004; H01Q 17/005; H01Q 17/007; H01Q 17/008
USPC ..................... 342/1–4; 359/642; 343/700 MS
See application file for complete search history.

(56) References Cited

U.S. PATENT DOCUMENTS 3,325,808 A * 6/1967 Manning ........................... 342/3
3,938,152 A * 2/1976 Grimes et al. .................... 342/1
(Continued)

FOREIGN PATENT DOCUMENTS

CN    101540207 A    9/2009
JP    2003-324008 A    11/2003
JP    2006-127427 A    5/2006

OTHER PUBLICATIONS

Liu et al., "Research on Absorbing Properties of Metamaterial Absorber", Materials Review: the research part, May 2010, vol. 24, No. 5, pp. 1-3 and 18.

*Primary Examiner* — Bernarr Gregory
(74) *Attorney, Agent, or Firm* — Birch, Stewart, Kolasch & Birch, LLP

(57) ABSTRACT

The present invention relates to a wave-absorbing metamaterial, comprising a substrate which is provided with two opposite lateral surfaces, wherein a plurality of periodically arranged artificial metal microstructures are attached on at least one of the two opposite lateral surfaces; when an electromagnetic wave having an incident direction vertical to the two opposite lateral surfaces of the substrate is transmitted to the wave-absorbing metamaterial, a relative permittivity of the metamaterial is substantially equal to a relative magnetic conductivity of the metamaterial. A wave-absorbing principle different from that of a conventional wave-absorbing material is employed on the wave-absorbing metamaterial; an ideal wave-absorbing effect is achieved by periodically arranging various artificial metal microstructures on the substrate and adjusting the artificial metal microstructures; and the wave-absorbing metamaterial has the advantages of minor weight, small thickness and simply adjustable electromagnetic parameters.

17 Claims, 6 Drawing Sheets

(51) Int. Cl.
*H05K 9/00* (2006.01)
*G01S 13/00* (2006.01)

(56) References Cited

U.S. PATENT DOCUMENTS

| | | | |
|---|---|---|---|
| 5,298,903 A * | 3/1994 | Janos | 342/4 |
| 5,385,623 A * | 1/1995 | Diaz | 342/4 |
| 6,756,932 B1 * | 6/2004 | Barker et al. | 342/4 |
| 7,301,493 B1 * | 11/2007 | Canales et al. | 342/1 |
| 7,336,215 B2 * | 2/2008 | Marin Palacios et al. | 342/1 |
| 7,420,524 B2 * | 9/2008 | Werner et al. | 343/700 MS |
| 7,965,219 B1 * | 6/2011 | Humfeld | 342/1 |
| 8,013,777 B2 * | 9/2011 | Sim et al. | 342/1 |
| 8,164,506 B2 * | 4/2012 | Sim et al. | 342/4 |
| 8,179,298 B2 * | 5/2012 | Sim | 342/1 |
| 8,488,247 B2 * | 7/2013 | Cai et al. | 359/642 |

* cited by examiner

WAVE-ABSORBING METAMATERIAL

FIELD OF THE INVENTION

The present invention relates to a wave-absorbing material, and in particular, to a wave-absorbing metamaterial.

BACKGROUND OF THE INVENTION

A wave-absorbing material refers to a functional composite material intended to absorb and attenuate incident electromagnetic wave energy and convert the electromagnetic energy thereof into heat energy or other forms of energy by using dielectric loss of the material. The wave-absorbing material sees a significant application prospect in such aspects as electromagnetic pollution control and stealth material manufacture.

Frequently used wave-absorbing materials at present include ferrite, barium titanate, metal micro-powder, graphite, silicon carbide, conductive fiber, and the like, among which the ferrite is a mostly researched and a relatively mature wave-absorbing material. The ferrite has a higher permeability and a higher resistivity under a high frequency, which causes the electromagnetic wave to enter easily and attenuate quickly. However, the wave-absorbing material denoted by the titanate has such defects as poor high-temperature endurance, high areal density, and complicated electromagnetic parameter matching.

SUMMARY OF THE INVENTION

In view of the defaults in the prior art, a technical problem to be solved in the present invention is to provide a wave-absorbing metamaterial with good wave-absorbing property, minor weight, small thickness, and simply adjustable electromagnetic parameters.

A technical solution employed by the present invention to solve the technical problem thereof is that the present invention is a wave-absorbing metamaterial, which comprises a substrate and a plurality of artificial metal microstructures periodically arranged inside the substrate. When an electromagnetic wave is transmitted to the wave-absorbing metamaterial, a relative permittivity of the metamaterial is substantially equal to a relative magnetic conductivity of the metamaterial.

When the electromagnetic wave is transmitted to the wave-absorbing metamaterial, an imaginary part of the relative permittivity of the metamaterial is greater than an imaginary part of a relative permittivity of the substrate and/or an imaginary part of the relative magnetic conductivity of the metamaterial is greater than an imaginary part of a relative magnetic conductivity of the substrate, such that the electromagnetic wave is absorbed.

The wave-absorbing metamaterial comprises a substrate which is provided with two opposite lateral surfaces, wherein a plurality of periodically arranged artificial metal microstructures are attached on at least one of the two opposite lateral surfaces. When an electromagnetic wave having an incident direction vertical to the two opposite lateral surfaces of the substrate is transmitted to the wave-absorbing metamaterial, the relative permittivity of the metamaterial is substantially equal to the relative magnetic conductivity of the metamaterial.

When the electromagnetic wave having the incident direction vertical to the two opposite lateral surfaces of the substrate is transmitted to the wave-absorbing metamaterial, the imaginary part of the relative permittivity of the metamaterial is greater than the imaginary part of the relative permittivity of the substrate and/or the imaginary part of the relative magnetic conductivity of the metamaterial is greater than the imaginary part of the relative magnetic conductivity of the substrate such that the electromagnetic wave is absorbed.

A first artificial metal microstructure is attached on one of the two opposite lateral surfaces of the substrate and a second artificial metal microstructure one-to-one corresponding to the first artificial metal microstructure is attached on the other of the two opposite lateral surfaces of the substrate. The first artificial metal microstructure comprises two first metal branches that are mutually and vertically connected to form a cross shape, and second metal branches respectively connected to two ends of the first metal branch and vertical to the first metal branch. The second artificial metal microstructure consists of a third metal branch having a quadrilateral, and one side of the quadrilateral of the third metal branch is provided with a gap.

The midpoints of the second metal branches of the first artificial metal microstructure are respectively arranged at the midpoints of the first metal branches that are connected thereto. The second artificial metal microstructure consists of a third metal branch having a square, and the midpoint of one side of the square of the third metal branch is provided with a gap.

The artificial metal microstructure comprises a first metal branch, a second metal branch and a third metal branch. The first metal branch forms a quadrangle one side of which is provided with a gap. One end of the second metal branch is arranged on a side of the quadrangle opposite to the gap, extends towards the gap and extrudes out of the gap. The third metal branch is vertical to the other end of the second metal branch.

The artificial metal microstructure is a bilateral symmetry structure taking the second metal branch as an axis of symmetry.

The substrate is a sheet-like substrate, and the metamaterial is formed by superposition of the sheet-like substrates attached with the plurality of artificial metal microstructures.

The artificial metal microstructure is formed by three identical planar topology structures each two of which vertically intersect at a common midpoint in a three-dimensional space.

The planar topology structure comprises two first metal branches, four second metal branches, eight third metal branches and one fourth metal branch having a quadrilateral. The two first metal branches mutually and vertically intersect to form a cross shape; the second metal branches are respectively connected to two ends of the two first metal branches, shorter than the first metal branch and vertical to the first metal branch. The third metal branches extend inwards from the two ends of the second metal branches. The fourth metal branch is provided with a gap on one side thereof and is arranged in a plane enclosed by the four second metal branches. The lengths of the four sides of the fourth metal branch are smaller than those of the second metal branches. Moreover, the side of the fourth metal branch that is provided with the gap does not intersect with the first metal branches, and the other three sides of the fourth metal branch all intersect with the first metal branches.

The planar topology structure further comprises two fifth metal branches extending inwards from the two ends of the gap.

A 45-degree angle is formed between the third metal branch and the second metal branch connected thereto.

The midpoint of the fourth metal branch coincides with the intersection point of the two first metal branches.

The substrate is formed by a plurality of sheet-like substrates. Each of the sheet-like substrates is attached with a plurality of metal branches. When the plurality of sheet-like substrates are combined, the plurality of metal branches attached on the plurality of sheet-like substrates form the artificial metal microstructures.

The substrate is a macromolecular polymer, ceramics, a ferroelectric material, a ferrite material, or a ferromagnetic material.

The plurality of periodically arranged artificial metal microstructures are attached on at least one of the two opposite lateral surfaces of the substrate via etching, electroplating, diamond etching, photoetching, electroetching and ion etching.

Wave-absorbing principles different from those of conventional wave-absorbing materials are employed on the wave-absorbing metamaterial according to the present invention. An ideal wave-absorbing effect is achieved by periodically arranging various artificial metal microstructures on the substrate and adjusting sizes of the artificial metal microstructures. In addition, the wave-absorbing metamaterial has the advantages minor weight, small thickness, less interference from ambient environments, and simply adjustable electromagnetic parameters. Further, the artificial metal microstructures of the wave-absorbing metamaterial may be a three-dimensional structure, which effectively absorbs electromagnetic waves from any incident direction of a three-dimensional space, thereby improving practicability of the wave-absorbing metamaterial. Further, according to the present invention, the metamaterial is formed by combining sheet-like substrates into an integrated substrate, such that the sizes and spaces of the artificial metal microstructures inside the metamaterial may be separately and conveniently adjusted. To be specific, the relative permittivity and the relative magnetic conductivity of the metamaterial are conveniently adjustable.

BRIEF DESCRIPTION OF THE DRAWINGS

To illustrate the technical solutions in embodiments of the present invention more clearly, the attached drawings necessary for description of the embodiments will be introduced briefly herein below. Obviously, these attached drawings only illustrate some exemplary embodiments of the present invention, and persons of ordinary skill in the art may further derive other drawings according to these attached drawings without making inventive efforts. Among the attached drawings.

DETAILED DESCRIPTION OF THE INVENTION

Figure 1:
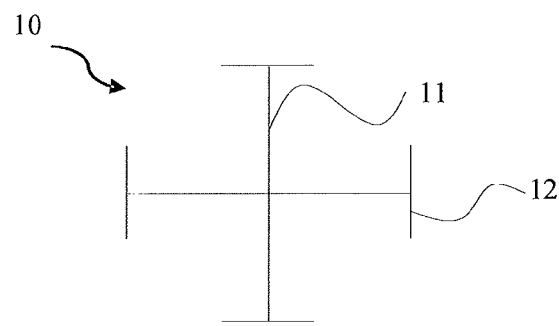
FIG. 1 is a schematic view of a first artificial metal microstructure attached on one lateral surface of a substrate according to a first preferred embodiment illustrating the wave-absorbing metamaterial.

A basic physical principle of a wave-absorbing material is that the material effectively absorbing an incident electromagnetic wave, converts electromagnetic wave energy into heat energy or other forms of energy, and dissipate the energy. The material shall have two features: an impedance matching feature and an attenuation feature. The impedance matching feature refers to a reflection feature formed by reflecting an electromagnetic wave incident from a free space to the surface of the wave-absorbing material over the surface of the wave-absorbing material. When an ideal wave-absorbing material expects to achieve a perfect impedance matching feature, the electromagnetic wave incident from the free space shall form zero reflection on the surface of the ideal wave-absorbing material. To be specific, the electromagnetic wave completely enters the inside of the ideal wave-absorbing material. Since an impedance Z of the free space is equal to 1, as known from formula $Z=\sqrt{\in/\mu}$, an ideal impedance matching feature can be achieved when a relative permittivity $\in$ of the metamaterial is substantially equal to a relative magnetic conductivity μ thereof. The relative permittivity $\in=\in'-j\in''$ and the relative magnetic conductivity $\mu=\mu'-j\mu''$ due to the loss of the wave-absorbing material. The attenuation feature refers to a phenomenon that the electromagnetic wave entering the inside of the material produces losses and is thus absorbed. The losses may be denoted by an electrical loss factor tan $\delta e=\in''/\in'$ and a magnetic loss factor Tan $\delta m=\mu''/\mu'$. Various wave-absorbing materials all pursue an objective of not only meeting the impedance matching feature but also meeting the attenuation feature.

A metamaterial is formed by artificial metal microstructures having specific pattern shapes periodically arranged in a substrate according to a particular manner. Each artificial metal microstructure and the substrate attached thereon form a basic unit of the metamaterial; and the metamaterial may enable a macroscopic response to the electromagnetic wave by arranging a plurality of basic units of the metamaterial according to a certain rules. Since the metamaterial entirely needs to enable a macroscopic electromagnetic response to the incident electromagnetic wave, the responses made by the metamaterial basic units to the incident electromagnetic wave need to form a continuous response. This requires that the size of each metamaterial basic unit be smaller than one fifth of the wavelength of the incident electromagnetic wave, and be preferably one tenth of the wavelength of the incident electromagnetic wave. In the description, the entire metamaterial is artificially divided into a plurality of metamaterial basic unit. However, it should be known that such division is merely for ease of description, and the metamaterial should not be considered as being formed or spliced using a plurality of metamaterial basic units. In practice, a metamaterial is formed by periodically arranging artificial metal microstructures on a substrate. Therefore, the process of metamaterial manufacture is simple and economic. Periodical arrangement is such that the artificial metal microstructures on each artificially divided metamaterial basic unit can generate a continuous electromagnetic response to the incident electromagnetic wave.

The pattern shapes or sizes of the artificial metal microstructures on each basic unit of the metamaterial are changed to enable the metamaterial to have different permittivities and different magnetic conductivities, thereby enabling the metamaterial to make different electromagnetic responses.

The present invention designs a metamaterial capable of strongly absorbing an electromagnetic wave at a specific frequency band by employing the principle of the metamaterial. The metamaterial comprises a substrate provided with two opposite lateral surfaces, and a plurality of periodically arranged artificial metal microstructures are attached on at least one of the two opposite lateral surfaces. When the artificial metal microstructures are not attached on the surface of the substrate, the substrate possesses a relative permittivity $\in_1$ and a relative magnetic conductivity $\mu_1$ to an electromagnetic field. When the artificial metal microstructures are attached on the surface of the substrate, the artificial metal microstructures may respond to an incident electromagnetic field such that the substrate and the artificial metal microstructures integrally form a metamaterial. The response made by the metamaterial to the electromagnetic field may be changed with a change of a size of the artificial metal microstructure. To be specific, a relative permittivity $\in$ and a relative magnetic conductivity $\mu$ of the metamaterial may be changed with the change of the size of the artificial metal microstructure. When the metamaterial serves as a wave-absorbing material, a topological pattern and the size of the artificial metal microstructure need to be designed in combination with the original relative permittivity $\in_1$ and the original relative magnetic conductivity $\mu_1$ of the substrate to enable the metamaterial to meet design requirements for the wave-absorbing material. To be specific, both the impedance matching feature and the attenuation feature are excellent.

The artificial metal microstructure needs to respond to both an electric field and a magnetic field of an incident electromagnetic wave. Therefore, a plane on which the artificial metal microstructure is located needs to have an electric field component and a magnetic field component. According to an electromagnetic field theory, the requirements can be met when an incident direction of the electromagnetic wave is vertical to a surface on which the artificial metal microstructure is located. Moreover, to better meet a requirement for the attenuation feature, various common materials having large loss of the electromagnetic wave, such as macromolecular polymer, ceramics, ferroelectric material, ferrite material, or a ferromagnetic material, are employed as the substrate of the metamaterial. A macromolecular polymer is preferably an FR-4 or F4B material.

Referring to FIG. 1 to FIG. 7, the following describes a design principle of the present invention with reference to several topology patterns of the artificial metal microstructures.

Figure 2:
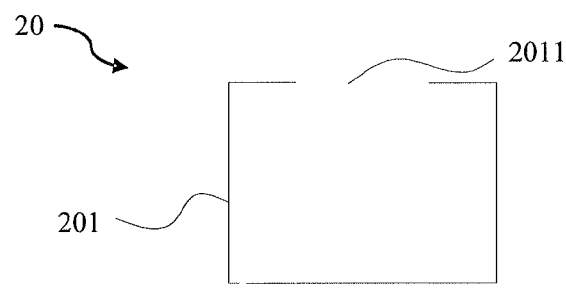
FIG. 2 is a schematic view of a second artificial metal microstructure attached on the other lateral surface of the substrate according to the first preferred embodiment illustrating the wave-absorbing metamaterial.

In a first preferred embodiment of the present invention, two different artificial metal microstructures are attached on two opposite lateral surface of a substrate, as illustrated in FIG. 1 and FIG. 2. A first artificial metal microstructure 10 on one lateral surface of the substrate comprises two first metal branches 11 that are mutually and vertically connected to form a cross shape, and second metal branches 12 respectively connected to two ends of first metal branches 11 and vertical to the first metal branches 11. A second artificial metal microstructure 20 on the other lateral surface of the substrate comprises a third metal branch 201. The third metal branch 201 forms a quadrangle one side of which is provided with a gap 2011. The two artificial metal microstructures one-to-one correspond to each other at the two opposite lateral surfaces of the substrate. Preferably, the midpoints of the second metal branches 12 of the first artificial metal microstructure 10 are respectively arranged at the endpoints of the first metal branches 11 that are connected thereto; the second artificial metal microstructure 20 consists of a third metal branch having a square 201, and the midpoint of one side of the square of the third metal branch is provided with the gap 2011.

When an electromagnetic wave having an incident direction vertical to the two opposite lateral surfaces of the substrate is transmitted to a metamaterial, the second metal branches 12 of the first artificial metal microstructure 10 respectively collect positive and negative electrons to form an equivalent capacitive element. As known from formula $$\varepsilon = \frac{GS}{4\pi kd},$$

where $\in$ denotes a relative permittivity of the metamaterial, S denotes the area of the second metal branch, d denotes a space of the second metal branch, k denotes a constant, and C refers to an equivalent capacitance. The relative permittivity $\in$ of the metamaterial may be adjusted by adjusting the area S of the second metal branch 12 and the space d of the second metal branch 12. The space d of the second metal branch 12 is the length of the first metal branch 11. A ring current is formed on the third metal branch 201 of the second artificial metal microstructure 20. According to the right-hand screw rule, the ring current produces a magnetic field, affecting a relative magnetic conductivity $\mu$ of the metamaterial. Responses of the artificial metal microstructures to an incident electric field and an incident magnetic field may be adjusted by respectively adjusting the sizes and the spaces of the metal branches of the first artificial metal microstructure 10 and the second artificial metal microstructure 20, thereby adjusting the entire relative permittivity $\in$ and the entire relative magnetic conductivity $\mu$ of the metamaterial.

Figure 5:
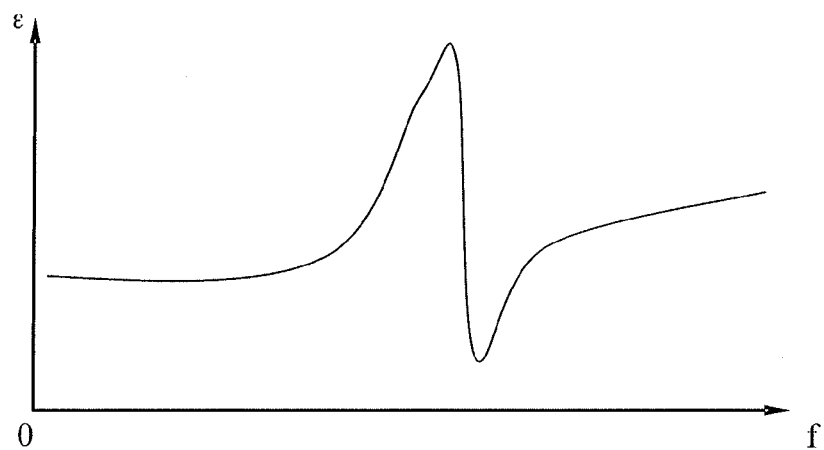
FIG. 5 is a schematic view of an $\in$-f relationship between a relative permittivity $\in$ and an electromagnetic wave frequency f of the wave-absorbing metamaterial.
Figure 6:
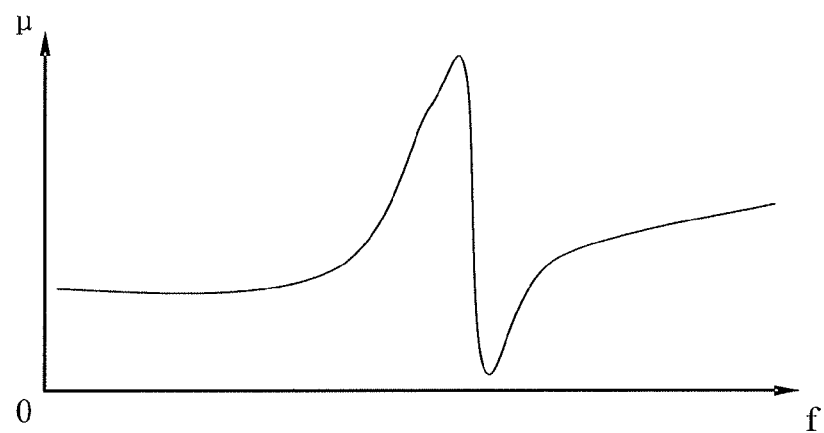
FIG. 6 is a schematic view of a μ-f relationship between a relative magnetic conductivity μ and the electromagnetic wave frequency f of the wave-absorbing metamaterial.

FIGS. 5 and 6 illustrate relationships between the entire relative permittivity $\in$ and the entire relative magnetic conductivity $\mu$ of the metamaterial and an electromagnetic wave frequency f. As illustrated in FIG. 5 and FIG. 6, changes of the relative permittivity $\in$ and the relative magnetic conductivity µ are tiny at a position far from a resonant frequency point. Therefore, changing the relative permittivity ∈ and the relative magnetic conductivity µ by adjusting the metal size of the artificial metal microstructure also creates insignificant effect. However, both the relative permittivity ∈ and the relative magnetic conductivity µ change exponentially at a frequency band approaching the resonant frequency point. At this moment, adjusting the metal size of the artificial metal microstructure greatly affects the entire relative permittivity ∈ and the entire relative magnetic conductivity µ of the metamaterial, thereby meeting an impedance matching requirement of the present invention. To be specific, the relative permittivity ∈ of the metamaterial is substantially equal to the relative magnetic conductivity µ thereof at the same frequency band. Therefore, the frequency band desired in the present invention is generally a frequency band deviating from the resonant frequency point of the artificial metal microstructure and capable of enabling the relative permittivity ∈ and the relative magnetic conductivity µ to attenuate exponentially. Assuredly, the description herein merely illustrates rules in an experimental process of the present invention, rather than limiting an incident frequency band of the electromagnetic wave of the present invention.

When the size of the artificial metal microstructure is such that the incident electromagnetic wave having a frequency band is transmitted to the metamaterial, a design requirement for impendence matching of the present invention is met when the relative permittivity ∈ of the metamaterial is substantially equal to the relative magnetic conductivity µ thereof. The term "substantially equal" allows an error not affecting the impendence matching effect between the relative permittivity ∈ and the relative magnetic conductivity µ. Meanwhile, the size of the artificial metal microstructure needs to be further adjusted such that the metamaterial has a maximum energy loss on the incident electromagnetic wave, to achieve an excellent wave-absorbing property. The energy loss is mainly denoted by an electrical loss factor tan δe and a magnetic loss factor tan δm; and different substrates correspond to different major loss factors. For example, a ferroelectric material mainly corresponds to the electrical loss factor, a ferromagnetic material corresponding to the magnetic loss factor, and a ferrite corresponds to both. An impact of the artificial metal microstructure on the entire attenuation feature of the metamaterial is to improve the entire attenuation feature of the metamaterial by improving an attenuation feature of the substrate, that is, improving an imaginary part of the entire relative permittivity and/or an imaginary part of the entire relative magnetic conductivity of the metamaterial. It is understandable that a process of adjusting the size of the artificial metal microstructure to enable the metamaterial to meet a condition that the relative permittivity ∈ is substantially equal to the relative magnetic conductivity µ and a process of improving the attenuation feature of the substrate are interactive, rather than adjusting a second condition based on the original after adjusting one condition.

Figure 3:
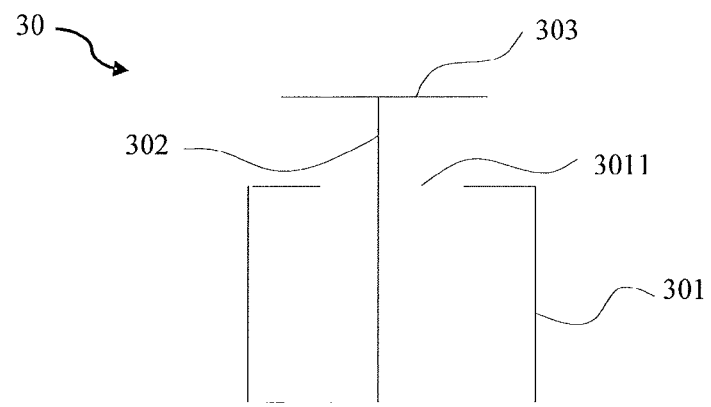
FIG. 3 illustrates an artificial metal microstructure according to a second preferred embodiment illustrating the wave-absorbing metamaterial.

FIG. 3 illustrates of an artificial metal microstructure according to a second preferred embodiment of the present invention. The artificial metal microstructure 30 comprises a first metal branch 301, a second metal branch 302 and a third metal branch 303. The first metal branch 301 forms a quadrangle one side of which is provided with a gap 3011. One end of the second metal branch 302 is arranged on the side of the quadrangle opposite to the gap 3011, extends towards the gap 3011, and extrudes out of the gap 3011. The third metal branch 303 is vertical to the other end of the second metal branch 302. The artificial metal microstructure 30 is attached on one of two opposite lateral surfaces of a substrate. Preferably, the artificial metal microstructure 30 is attached on both the two opposite lateral surfaces of the substrate and the artificial metal microstructure on the two opposite lateral surfaces forms mirror symmetry to obtain a better wave-absorbing effect. Further preferably, the artificial metal microstructure 30 on each lateral surface is a bilateral symmetry structure taking the second metal branch 302 as an axis of symmetry.

Figure 4:
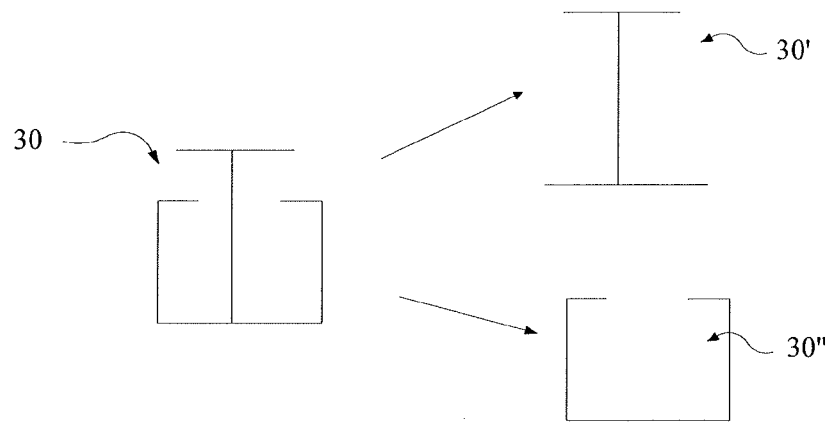
FIG. 4 is a schematic decomposition principle view of a response from the artificial metal microstructure to incident electromagnetic wave electric field and magnetic field responses according to the second preferred embodiment illustrating the wave-absorbing metamaterial.

The artificial metal microstructure 30 in the preferred embodiment is equivalent to an artificial metal microstructure combining the first artificial metal microstructure 10 and the second artificial metal microstructure 20 in the first preferred embodiment, and an electromagnetic response principle of the artificial metal microstructure 30 is the same as that described in the first preferred embodiment. To be specific, a relative metal branch functions equivalently as a capacitor to adjust a relative permittivity ∈ of a metamaterial, and a current induced on a ring metal branch induces a magnetic field according to the right-hand screw rule, to adjust a relative magnetic conductivity µ of the metamaterial. It can be specifically represented in the embodiment that: As illustrated in FIG. 4, the artificial metal microstructure 30 is split into a first portion 30' in an "T" shape and a second portion 30" having a quadrilateral, wherein one side of the quadrilateral of the second portion is provided with a gap. Metal branches of the first portion 30' respectively collect positive and negative charges to form an equivalent capacitive element to adjust the relative permittivity of the metamaterial, and a metal branch of the second portion 30" forms a ring current and induces a magnetic field to adjust the relative magnetic conductivity of the metamaterial. Meanwhile, the pattern design in the preferred embodiment on the artificial metal microstructure is such unique that the artificial metal microstructure is attached on one lateral surface of the substrate, thereby meeting a design requirement.

The substrate and a technique of attaching the artificial metal microstructure on the substrate are the same as that those described in the first preferred embodiment, which are thus not described herein any further.

Figure 7:
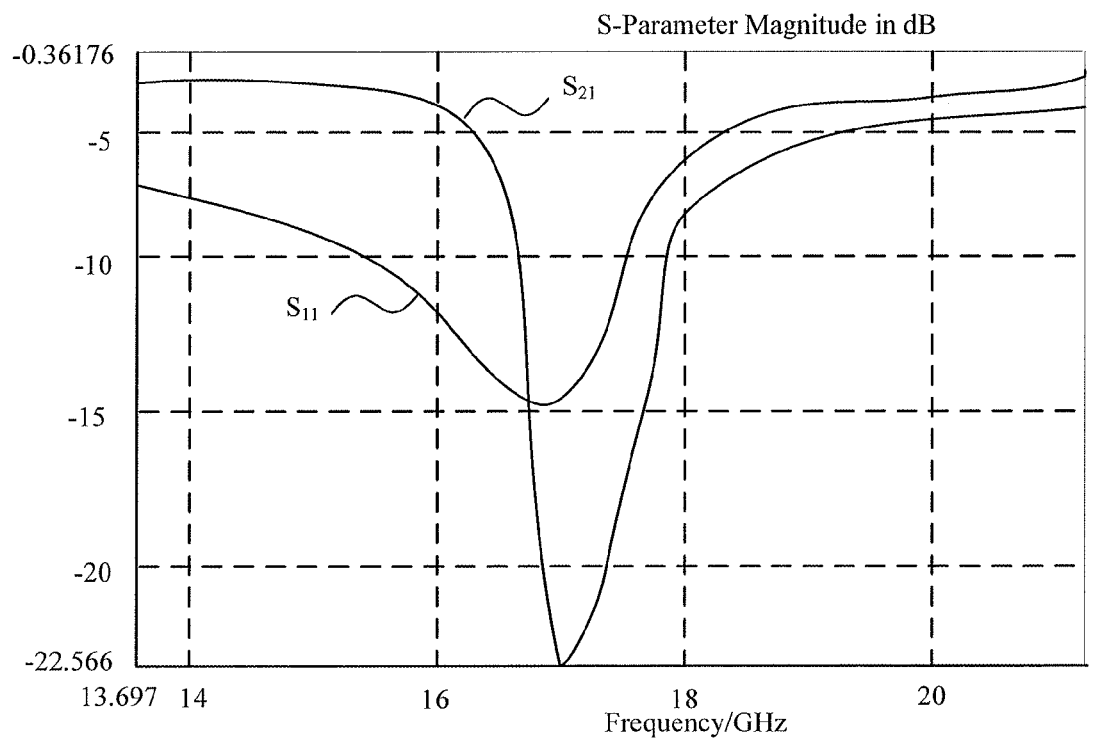
FIG. 7 is a perspective view of computer simulation of the artificial metal microstructure attached on one lateral surface of the substrate according to the second preferred embodiment illustrating the wave-absorbing metamaterial.

FIG. 7 is a perspective view of computer simulation of an artificial metal microstructure attached on one lateral surface of the substrate in the preferred embodiment. In computer simulation, a reflection coefficient, i.e., impendence matching feature, of the metamaterial is denoted by $S_{11}$, and a transmission coefficient, i.e., attenuation feature, of the metamaterial is denoted by $S_{21}$. It can be seen from FIG. 5 that $S_{11}$ has an obvious peak approaching 17 GHz and $S_{21}$ may be less than −15 dB approaching a high bandwidth. To be specific, both the impendence matching feature and the attenuation feature are better, and absorption of the electromagnetic wave is achieved.

In another embodiment of the present invention, a three-dimensional artificial metal microstructure is employed. The topological structure design of the three-dimensional artificial metal microstructure is such unique that the artificial metal microstructure makes same electromagnetic response both to approaching an electric field and a magnetic field of an electromagnetic wave of any incident direction. Therefore, the electromagnetic wave of any incident direction can be absorbed when being transmitted to a metamaterial, thereby greatly improving an application range of the wave-absorbing metamaterial; and detailed descriptions are made as follows:

Referring to FIG. 5, FIG. 6 and FIGS. 8-12, the following describes the present invention in details with reference to several topologies of the artificial metal microstructures.

Figure 8:
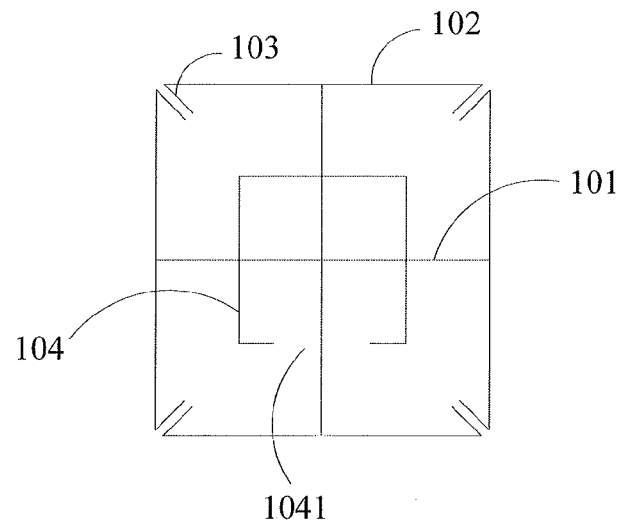
FIG. 8 is a planar topology of a three-dimensional structure of an artificial metal microstructure according to a third preferred embodiment illustrating the wave-absorbing metamaterial.
Figure 9:
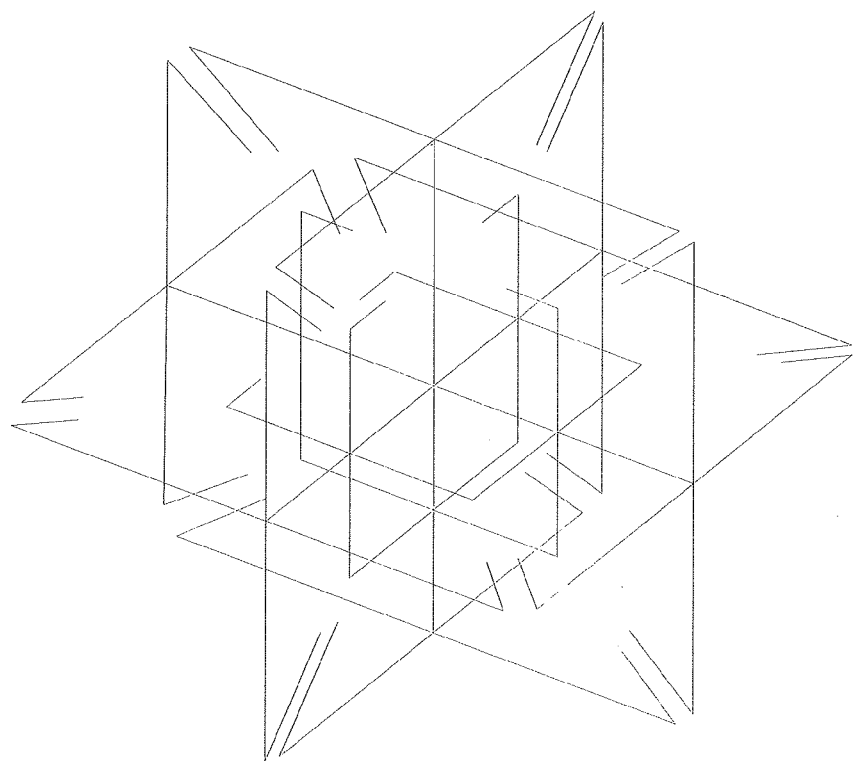
FIG. 9 is a schematic view of the three-dimensional structure of the artificial metal microstructure according to the third preferred embodiment illustrating the wave-absorbing metamaterial.

Please refer to FIG. 8 and FIG. 9. FIG. 9 is a schematic view of a three-dimensional structure of the artificial metal microstructure of the embodiment, wherein the artificial metal microstructure is formed by three planar topologies each two of which vertically intersect at a common midpoint in a three-dimensional space as illustrated in FIG. 8. As illustrated in FIG. 8, the planar topology comprises two first metal branches 101, four second metal branches 102, eight third metal branches 103 and one quadrangular fourth metal branch 104. The two first metal branches 101 mutually and vertically intersect to form a cross shape. The second metal branches 102 are respectively connected to the two ends of the two first metal branches 101, shorter than the first metal branches 101 and vertical to the first metal branches 101. The third metal branches 103 extend inwards from the two ends of the second metal branches 102 by same angle. The fourth metal branch 104 is provided with a gap 1041 on one side and is arranged in a plane enclosed by the four second metal branches 102. The lengths of the four sides of the fourth metal branch 104 are smaller than those of the second metal branches 102. Moreover, the side of the fourth metal branch 104 that is provided with the gap 1041 does not intersect with the first metal branches 101, and the other three sides of the fourth metal branch 104 all intersect with the first metal branches 101.

When the electromagnetic wave of any incident direction in the three-dimensional space is transmitted to the metamaterial, spaces between the metal branches in a plane corresponding to an electric field direction of the electromagnetic wave are equivalent as a capacitive element. It can be known from a formula $$\varepsilon = \frac{GS}{4\pi kd}$$

that a relative permittivity ∈ of the metamaterial can be adjusted by adjusting the area S of the metal branches having spaces as well as a space d; a plane corresponding to a magnetic field polarization direction of the electromagnetic wave is entirely equivalent as an inductor. Moreover, a ring current is formed on the plane. According to the right-hand screw rule, the ring current produces a magnetic field so as to affect a relative magnetic conductivity μ of the metamaterial.

Figure 10:
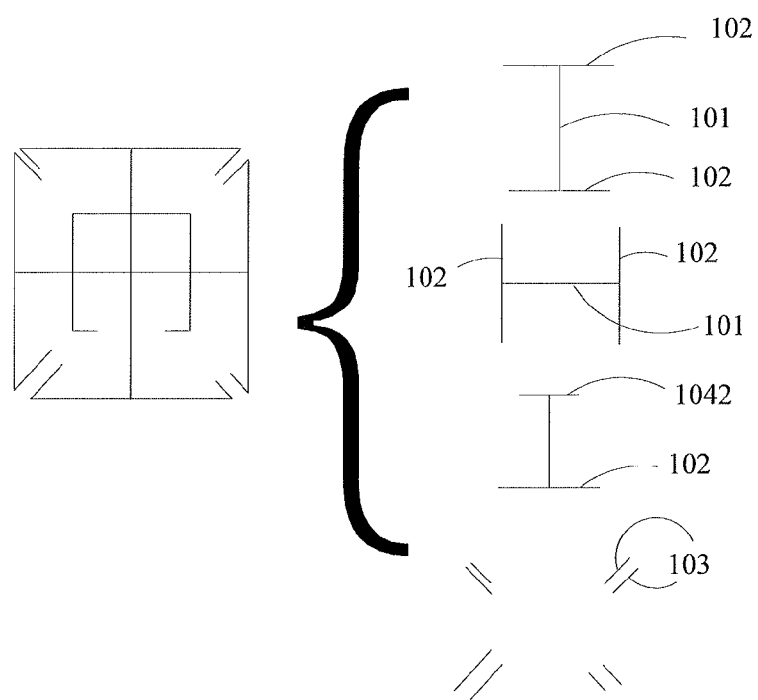
FIG. 10 illustrates a plurality of equivalent topologies split from the planar topology of the artificial metal microstructure corresponding to the electromagnetic wave vertically incident to a plane in a three-dimensional space and capable of responding to an electric field according to the third preferred embodiment illustrating the wave-absorbing metamaterial.
Figure 11:
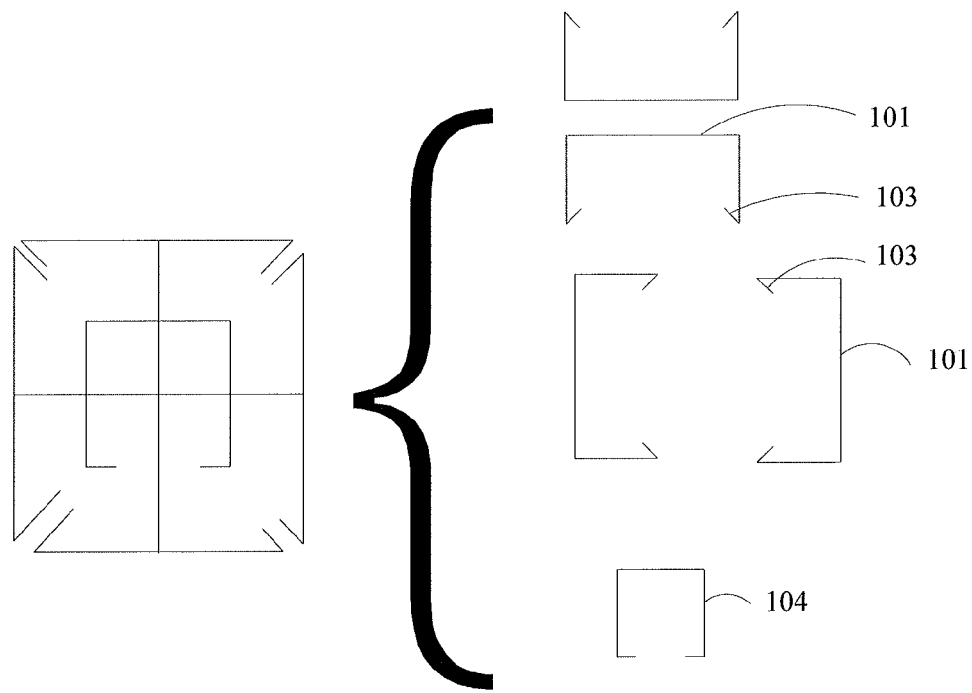
FIG. 11 illustrates a plurality of equivalent topologies split from the planar topology of the artificial metal microstructure corresponding to the electromagnetic wave vertically incident to the plane in the three-dimensional space and capable of responding to a magnetic field according to the third preferred embodiment of the wave-absorbing metamaterial.

In the specific embodiment, a two-dimensional topology as illustrated in FIG. 8 is considered as one planar topology structure of the artificial metal microstructure of the present invention; when the electromagnetic wave having an incident direction vertical to the plane is transmitted to the metamaterial, the planar topology responds to the electromagnetic wave of any incident direction vertical to the plane in the three-dimensional space, and can be equivalently split into a plurality of topology structures, as illustrated in FIG. 10 and FIG. 11. FIG. 10 illustrates a plurality of topology structures of the planar topology structure split for responding to the electric field. FIG. 11 illustrates a plurality of topology structures of the planar topology structure split for responding to the magnetic field. The topology structure split in FIG. 10 consists of: (1) two pairs of the second metal branches 102; (2) four pairs of the third metal branches 103; and (3) the second metal branch 102 opposite to the gap 1041 as well as an opposite side 1042 opposite to the gap 1041. The planar topology structure in FIG. 11 is split into a plurality of open ring metal branches, mainly consisting of: (1) the first metal branches 101, the third metal branches 103 and the second metal branches 102 connected to the first metal branches 101 and the third metal branches 103; and (2) the fourth metal branch 104. It can be seen from FIG. 10 and FIG. 11 that when the electromagnetic wave having an incident direction vertical to any direction of the planar topology structure in the three-dimensional space is transmitted to the metamaterial, the topology structural design in the present invention is such special that the relative permittivity and the relative magnetic conductivity of the metamaterial may both be adjusted by adjusting an area and/or length of each metal branch of the artificial metal microstructure. Further, the entire artificial metal microstructure of the present invention is formed by three identical planar topology structures each two of which vertically intersect at a common midpoint in the three-dimensional space. Therefore, the relative permittivity and the relative magnetic conductivity of the metamaterial can both be adjusted for the electromagnetic wave of any direction corresponding to the artificial metal microstructure of the present invention in the three-dimensional space.

FIGS. 5 and 6 illustrate relationships between the entire relative permittivity ∈ and the entire relative magnetic conductivity μ of the metamaterial and an electromagnetic wave frequency f. As illustrated in FIG. 5 and FIG. 6, changes of the relative permittivity ∈ and the relative magnetic conductivity μ are tiny at a position far from a resonant frequency point. Therefore, changing the relative permittivity ∈ and the relative magnetic conductivity μ by adjusting the metal size of the artificial metal microstructure also creates insignificant effect. However, both the relative permittivity ∈ and the relative magnetic conductivity μ change exponentially at a frequency band approaching to the resonant frequency point; at this moment, adjusting the metal size of the artificial metal microstructure will greatly affect the entire relative permittivity ∈ and the entire relative magnetic conductivity μ of the metamaterial, thereby achieving an impedance matching requirement of the present invention. To be specific, the relative permittivity ∈ of the metamaterial is substantially equal to the relative magnetic conductivity μ thereof at the same frequency band. Therefore, a frequency band desired in the present invention is generally a frequency band far from the resonant frequency point of the artificial metal microstructure and capable of enabling the relative permittivity ∈ and the relative magnetic conductivity μ to attenuate exponentially. Assuredly, the description herein merely illustrates rules in an experimental process of the present invention, rather than limiting an incident frequency band of the electromagnetic wave of the present invention.

When the size of the artificial metal microstructure is such that the incident electromagnetic wave having a frequency band is transmitted to the metamaterial, a design requirement for impendence matching of the present invention is met when the relative permittivity ∈ of the metamaterial is substantially equal to the relative magnetic conductivity μ thereof. The term "substantially equal" allows an error not affecting the impendence matching effect between the relative permittivity ∈ and the relative magnetic conductivity μ. Meanwhile, the size of the artificial metal microstructure needs to be further adjusted such that the metamaterial has a maximum energy loss on the incident electromagnetic wave, to achieve an excellent wave-absorbing property. The energy loss is mainly denoted by an electrical loss factor tan δe and a magnetic loss factor tan δm; and different substrates correspond to different major loss factors. For example, a ferroelectric material mainly corresponds to the electrical loss factor, a ferromagnetic material corresponding to the magnetic loss factor, and a ferrite corresponds to both. An impact of the artificial metal microstructure on the entire attenuation feature of the metamaterial is to improve the entire attenuation feature of the metamaterial by improving an attenuation feature of the substrate, that is to improve an imaginary part of the entire relative permittivity and/or an imaginary part of the entire relative magnetic conductivity of the metamaterial. It is understandable that a process of adjusting the size of the artificial metal microstructure to enable the metamaterial to meet a condition that the relative permittivity $\in$ of the metamaterial is substantially equal to the relative magnetic conductivity $\mu$ thereof and a process of improving the attenuation feature of the substrate are interactive, rather than adjusting a second condition based on the original after adjusting one condition.

Figure 12:
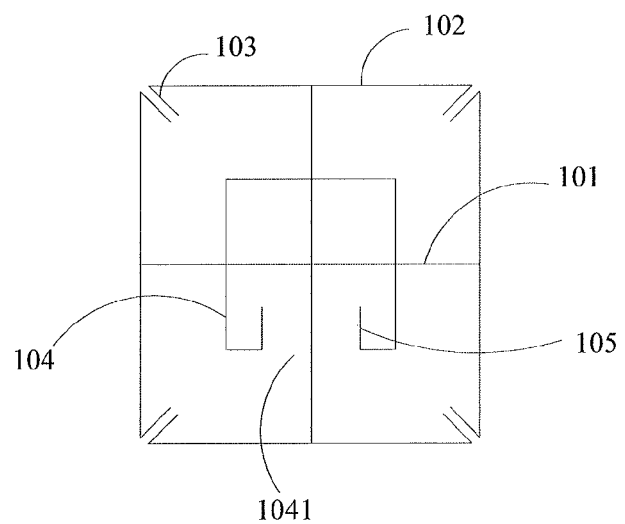
FIG. 12 is a topology derived from a planar topology of a three-dimensional structure of an artificial metal microstructure according to a fourth preferred embodiment of the wave-absorbing metamaterial.

FIG. 12 is a topology derived from a two-dimensional planar topology of a three-dimensional structure of an artificial metal microstructure in a fourth preferred embodiment of the wave-absorbing metamaterial of the present invention. The difference between the fourth preferred embodiment and the third preferred embodiment is that the two ends of a gap 1041 further extend inwards with two opposite fifth metal branches 106. The fifth metal branches 105 help to add a category of equivalent capacitive elements formed by electromagnetic waves incident from each direction of a three-dimensional space corresponding to the artificial metal microstructure, and change distribution of an open ring current in a fourth metal branch 104. Moreover, one parameter for adjusting a relative permittivity $\in$ and a relative magnetic conductivity $\mu$ of the entire metamaterial is added. Therefore, objectives of the present invention are simpler to achieve.

A substrate may be selected from such materials with high energy losses as a macromolecular polymer, ceramics, a ferroelectric material, a ferrite material or a ferromagnetic material.

The substrate usually employs a sheet-like structure. Each of the sheet-like substrates is attached with a plurality of artificial metal microstructures on one of two opposite lateral surfaces or each of the two opposite lateral surfaces. A plurality of artificial metal microstructures are tightly combined via gapless superposition to form an entire body.

The artificial metal microstructures can be attached on the surface of the substrate via a plurality of manufacturing processes such as etching, electroplating, diamond etching, photoetching, electroetching and ion etching. Etching is a preferred manufacturing process, which comprises the steps of: after designing a proper planer diagram of the artificial metal microstructures, entirely attaching a piece of metal foil on the substrate firstly; afterwards, removing a portion of the foil outside the preset diagram of the artificial metal microstructures by using etching equipment and a chemical reaction between a solvent and a metal; and subsequently obtaining the artificial metal microstructures arranged in a array from the remaining portion. A material of the metal foil may be any metal such as copper, silver, and the like.

Some preferred embodiments of the present invention have been described with reference to the attached drawings; however, the present invention is not limited to the aforesaid embodiments, and these embodiments are merely illustrative but are not intended to limit the present invention. Persons of ordinary skill in the art may further derive many other implementations according to the teachings of the present invention and within the scope defined in the claims, and all of the implementations shall fall within the scope of the present invention.

What is claimed is:

1. A wave-absorbing metamaterial, comprising a substrate and a plurality of artificial metal microstructures periodically arranged inside the substrate; wherein when an electromagnetic wave is transmitted to the wave-absorbing metamaterial, a relative permittivity of the metamaterial is substantially equal to a relative magnetic conductivity of the metamaterial.

2. The wave-absorbing metamaterial according to claim 1, wherein when the electromagnetic wave is transmitted to the wave-absorbing metamaterial, an imaginary part of the relative permittivity of the metamaterial is greater than an imaginary part of a relative permittivity of the substrate and/or an imaginary part of the relative magnetic conductivity of the metamaterial is greater than an imaginary part of a relative magnetic conductivity of the substrate such that the electromagnetic wave is absorbed.

3. The wave-absorbing metamaterial according to claim 2, wherein the substrate is provided with two opposite lateral surfaces, and a plurality of periodically arranged artificial metal microstructures are attached on at least one of the two opposite lateral surfaces; when an electromagnetic wave having an incident direction vertical to the two opposite lateral surfaces of the substrate is transmitted to the wave-absorbing metamaterial, the relative permittivity of the metamaterial is substantially equal to the relative magnetic conductivity of the metamaterial.

4. The wave-absorbing metamaterial according to claim 3, wherein when the electromagnetic wave having the incident direction vertical to the two opposite lateral surfaces of the substrate is transmitted to the wave-absorbing metamaterial, the imaginary part of the relative permittivity of the metamaterial is greater than the imaginary part of the relative permittivity of the substrate and/or the imaginary part of the relative magnetic conductivity of the metamaterial is greater than the imaginary part of the relative magnetic conductivity of the substrate, such that the electromagnetic wave is absorbed.

5. The wave-absorbing metamaterial according to claim 4, wherein a first artificial metal microstructure is attached on one of the two opposite lateral surfaces of the substrate and a second artificial metal microstructure one-to-one corresponding to the first artificial metal microstructure is attached on the other of the two opposite lateral surfaces of the substrate; wherein the first artificial metal microstructure comprises two first metal branches that are mutually and vertically connected form a cross shape, and second metal branches respectively connected to two ends of the first metal branch and vertical to the first metal branch; wherein the second artificial metal microstructure comprises a third metal branch having a quadrilateral, one side of the quadrilateral of the third metal branch is provided with a gap.

6. The wave-absorbing metamaterial according to claim 5, wherein the midpoints of the second metal branches of the first artificial metal microstructure are respectively arranged at the endpoints of the first metal branches; wherein the second artificial metal microstructure comprises the third metal branch having a square, and the midpoint of one side of the square of the third metal branch is provided with a gap.

7. The wave-absorbing metamaterial according to claim 3, wherein the artificial metal microstructure comprises a first metal branch, a second metal branch and a third metal branch, wherein the first metal branch forms a quadrangle one side of which is provided with a gap; wherein one end of the second metal branch is arranged on a side of the quadrangle opposite to the gap, extends towards the gap and extrudes out of the gap; and the third metal branch is vertical to the other end of the second metal branch.

8. The wave-absorbing metamaterial according to claim 7, wherein the artificial metal microstructure is a bilateral symmetry structure taking the second metal branch as an axis of symmetry.

9. The wave-absorbing metamaterial according to claim 3, wherein the substrate is a sheet-like substrate, and the metamaterial is formed by superposition of the sheet-like substrates attached with the plurality of artificial metal microstructures.

10. The wave-absorbing metamaterial according to claim 2, wherein the artificial metal microstructure is formed by three identical planar topology structures, each two of three identical planar vertically intersect at a common midpoint in a three-dimensional space.

11. The wave-absorbing metamaterial according to claim 10, wherein the planar topology structure comprises two first metal branches, four second metal branches, eight third metal branches and one fourth metal branch having a quadrilateral, wherein the two first metal branches mutually and vertically intersect to form a cross shape; the second metal branches are respectively connected to two ends of the two first metal branch, shorter than the first metal branch and vertical to the first metal branch; the third metal branches extend inwards from the two ends of the second metal branches; the fourth metal branch is provided with a gap on one side thereof and is arranged in a plane enclosed by the four second metal branches; the lengths of the four sides of the fourth metal branch are smaller than those of the second metal branches; moreover, the side of the fourth metal branch that is provided with the gap does not intersect with the first metal branches, and the other three sides of the fourth metal branch all intersect with the first metal branches.

12. The wave-absorbing metamaterial according to claim 11, wherein the planar topology structure further comprises two fifth metal branches extending inwards from the two ends of the gap.

13. The wave-absorbing metamaterial according to claim 11, wherein a 45-degree angle is formed between the third metal branch and the second metal branch.

14. The wave-absorbing metamaterial according to claim 11, wherein the midpoint of the fourth metal branch coincides with the intersection point of the two first metal branches.

15. The wave-absorbing metamaterial according to claim 1, wherein the substrate is formed by a plurality of sheet-like substrates; each of the sheet-like substrates is attached with a plurality of metal branches; when the plurality of sheet-like substrates are combined, the plurality of metal branches attached on the plurality of sheet-like substrates form the artificial metal microstructures.

16. The wave-absorbing metamaterial according to claim 1, wherein the substrate is a macromolecular polymer, ceramics, a ferroelectric material, a ferrite material, or a ferromagnetic material.

17. The wave-absorbing metamaterial according to claim 1, wherein the plurality of periodically arranged artificial metal microstructures are attached on at least one of the two opposite lateral surfaces of the substrate via etching, electroplating, diamond etching, photoetching, electroetching and ion etching.

* * * * *